United States Patent
Fitzpatrick

(10) Patent No.: US 9,368,914 B2
(45) Date of Patent: Jun. 14, 2016

(54) COMMUNICATION JACK HAVING A FLEXIBLE PRINTED CIRCUIT BOARD WITH JACKWIRE CONTACTS MOUNTED THEREON

(71) Applicant: CommScope, Inc. of North Carolina, Hickory, NC (US)

(72) Inventor: Brian J. Fitzpatrick, McKinney, TX (US)

(73) Assignee: CommScope, Inc. of North Carolina, Hickory, NC (US)

( * ) Notice: Subject to any disclaimer, the term of this patent is extended or adjusted under 35 U.S.C. 154(b) by 0 days.

(21) Appl. No.: 14/591,978

(22) Filed: Jan. 8, 2015

(65) Prior Publication Data

US 2015/0126073 A1    May 7, 2015

Related U.S. Application Data

(63) Continuation of application No. 13/803,078, filed on Mar. 14, 2013, now Pat. No. 8,961,238.

(60) Provisional application No. 61/699,903, filed on Sep. 12, 2012, provisional application No. 61/697,955, filed on Sep. 7, 2012.

(51) Int. Cl.
*H01R 24/00* (2011.01)
*H01R 13/6461* (2011.01)
*H01R 13/6466* (2011.01)
(Continued)

(52) U.S. Cl.
CPC ........ *H01R 13/6461* (2013.01); *H01R 13/6466* (2013.01); *H01R 13/6469* (2013.01); *H01R 24/00* (2013.01); *H01R 24/64* (2013.01); *H05K 1/0228* (2013.01); *H05K 1/0239* (2013.01); (Continued)

(58) Field of Classification Search
CPC ............. H01R 13/646; H01R 13/6461; H01R 13/6463; H01R 13/6464; H01R 13/6466; H01R 13/6473; H01R 23/005; H01R 13/6658
USPC .................................. 439/676, 941
See application file for complete search history.

(56) References Cited

U.S. PATENT DOCUMENTS 6,017,247 A   1/2000 Gwiazdowski
6,428,362 B1  8/2002 Phommachanh
(Continued)

FOREIGN PATENT DOCUMENTS

CA       2 464 834 A1    10/2005
DE    10 2007 00959 A1    8/2008
(Continued)

OTHER PUBLICATIONS

Engineering drawing and pictures of fixture for measuring crosstalk levels in RJ-45 plugs, where the fixture has two rows of pogo-pin contacts that contact the longitudinal portion of the plug blade (Admitted Prior Art).

(Continued)

*Primary Examiner* — Chandrika Prasad
(74) *Attorney, Agent, or Firm* — Myers Bigel & Sibley, P.A.

(57) ABSTRACT

Communications jacks include at least first through third jackwire contacts and a flexible substrate that has a first finger and a second finger. The first jackwire contact and the third jackwire contact are each mounted on the first finger and the second jackwire contact is mounted on the second finger.

20 Claims, 6 Drawing Sheets

(51) Int. Cl.
  *H01R 13/6469*  (2011.01)
  *H01R 24/64*   (2011.01)
  *H05K 1/02*    (2006.01)
  *H05K 1/14*    (2006.01)
  *H05K 1/16*    (2006.01)

(52) U.S. Cl.
  CPC .............. *H05K 1/147* (2013.01); *H05K 1/162* (2013.01); *H05K 2201/10189* (2013.01)

(56) References Cited

U.S. PATENT DOCUMENTS

| | | |
|---|---|---|
| 6,464,541 B1 | 10/2002 | Hashim et al. |
| 6,641,443 B1 | 11/2003 | Itano et al. |
| 7,153,168 B2 | 12/2006 | Caveney et al. |
| 7,179,131 B2 | 2/2007 | Caveney et al. |
| 7,252,554 B2 | 8/2007 | Caveney et al. |
| 7,264,516 B2 | 9/2007 | Hashim et al. |
| 7,281,957 B2 | 10/2007 | Caveney et al. |
| 7,320,624 B2 | 1/2008 | Hashim et al. |
| 7,326,089 B2 | 2/2008 | Hashim |
| 7,357,683 B2 | 4/2008 | Caveney et al. |
| 7,442,092 B2 | 10/2008 | Caveney et al. |
| 7,591,686 B2 | 9/2009 | Ellis et al. |
| 7,601,034 B1 * | 10/2009 | Aekins ............... H01R 13/6464 439/676 |
| 7,670,193 B2 | 3/2010 | Milette et al. |
| 7,682,203 B1 | 3/2010 | Pharney et al. |
| 7,823,281 B2 | 11/2010 | Caveney et al. |
| 7,824,231 B2 | 11/2010 | Marti et al. |
| 7,837,513 B2 | 11/2010 | Millette et al. |
| 7,850,492 B1 | 12/2010 | Straka et al. |
| 7,892,040 B2 | 2/2011 | Ellis et al. |
| 7,976,348 B2 | 7/2011 | Aekins et al. |
| 8,011,972 B2 | 9/2011 | Caveney et al. |
| 8,083,551 B2 | 12/2011 | Hetzer et al. |
| 8,167,661 B2 | 5/2012 | Straka |
| 8,435,083 B2 | 5/2013 | Hetzer et al. |
| 8,632,367 B2 * | 1/2014 | Caveney ............. H01R 13/719 439/676 |
| 8,641,452 B2 | 2/2014 | Patel et al. |
| 8,951,072 B2 | 2/2015 | Hashim |
| 2003/0232517 A1 | 12/2003 | Liu et al. |
| 2005/0181676 A1 | 8/2005 | Caveney |
| 2005/0202697 A1 | 9/2005 | Caveney et al. |
| 2005/0277339 A1 | 12/2005 | Caveney |
| 2007/0015417 A1 | 1/2007 | Caveney et al. |
| 2007/0190863 A1 | 8/2007 | Caveney et al. |
| 2007/0259571 A1 | 11/2007 | Chen |
| 2008/0132123 A1 | 6/2008 | Milette et al. |
| 2008/0261422 A1 * | 10/2008 | Hanyu ................. H01R 12/774 439/153 |
| 2010/0041274 A1 | 2/2010 | Marti et al. |
| 2010/0062644 A1 * | 3/2010 | Aekins ............... H01R 13/6625 439/620.21 |
| 2010/0124855 A1 | 5/2010 | Milette et al. |
| 2010/0190357 A1 | 7/2010 | Hashim |
| 2010/0203763 A1 | 8/2010 | Hetzer et al. |
| 2010/0317230 A1 | 12/2010 | Larsen |
| 2011/0065322 A1 | 3/2011 | Milette et al. |
| 2011/0124219 A1 | 5/2011 | Milette et al. |
| 2012/0156932 A1 | 6/2012 | Straka et al. |
| 2012/0164884 A1 | 6/2012 | Hetzer et al. |
| 2012/0244752 A1 | 9/2012 | Patel et al. |
| 2013/0210289 A1 | 8/2013 | Schumacher |
| 2014/0073198 A1 | 3/2014 | Moffitt et al. |
| 2014/0273629 A1 | 9/2014 | Canning |

FOREIGN PATENT DOCUMENTS

| | | |
|---|---|---|
| DE | 10 2007 005959 A1 | 8/2008 |
| FR | 2 919 434 A1 | 1/2009 |
| WO | WO 2009/039459 A2 | 3/2009 |

OTHER PUBLICATIONS

International Preliminary Report on Patentability and Written Opinion of the International Searching Authority for PCT/US2013/057246 mailed Mar. 10, 2015, 7 pages.

International Preliminary Report on Patentability and Written Opinion of the International Searching Authority for PCT/2013/057265 mailed Mar. 10, 2015, 7 pages.

* cited by examiner

COMMUNICATION JACK HAVING A FLEXIBLE PRINTED CIRCUIT BOARD WITH JACKWIRE CONTACTS MOUNTED THEREON

CROSS-REFERENCE TO RELATED APPLICATIONS

The present application claims priority under 35 U.S.C. §120 from U.S. patent application Ser. No. 13/803,078, which in turn claims priority under 35 U.S.C. §119(e) from U.S. Provisional Patent Application Ser. No. 61/699,903, filed Sep. 12, 2012 and to U.S. Provisional Patent Application Ser. No. 61/697,955, filed Sep. 7, 2012, the disclosure of each of the above applications is hereby incorporated herein by reference in its entirety.

FIELD OF THE INVENTION

The present invention relates generally to communications connectors and, more particularly, to communications jacks.

BACKGROUND

Computers, fax machines, printers and other electronic devices are routinely connected by communications cables to network equipment such as routers, switches, servers and the like. FIG. 1 illustrates the manner in which a computer 10 may be connected to a network device 30 (e.g., a network switch) using conventional communications plug/jack connections. As shown in FIG. 1, the computer 10 is connected by a patch cord 11 to a communications jack 20 that is mounted in a wall plate 18. The patch cord 11 comprises a communications cable 12 that contains a plurality of individual conductors (e.g., eight insulated copper wires) and first and second communications plugs 13, 14 that are attached to the respective ends of the cable 12. The first communications plug 13 is inserted into a plug aperture of a communications jack (not shown) that is provided in the computer 10, and the second communications plug 14 is inserted into a plug aperture 22 in the front side of the communications jack 20. The contacts or "blades" of the second communications plug 14 are exposed through the slots 15 on the top and front surfaces of the second communications plug 14 and mate with respective "jackwire" contacts of the communications jack 20. The blades of the first communications plug 13 similarly mate with respective jackwire contacts of the communications jack (not shown) that is provided in the computer 10.

The communications jack 20 includes a back-end wire connection assembly 24 that receives and holds insulated conductors from a cable 26. As shown in FIG. 1, each conductor of cable 26 is individually pressed into a respective one of a plurality of slots provided in the back-end wire connection assembly 24 to establish mechanical and electrical connection between each conductor of cable 26 and a respective one of a plurality of conductive paths (not shown in FIG. 1) through the communications jack 20. The other end of each conductor in cable 26 may be connected to, for example, the network device 30. The wall plate 18 is typically mounted on a wall (not shown) of a room of, for example, an office building, and the cable 26 typically runs through conduits in the walls and/or ceilings of the office building to a room in which the network device 30 is located. The patch cord 11, the communications jack 20 and the cable 26 provide a plurality of signal transmission paths over which information signals may be communicated between the computer 10 and the network device 30. It will be appreciated that typically one or more patch panels, along with additional communications cabling, would be included in the communications path between the cable 26 and the network device 30. However, for ease of description, in FIG. 1 the cable 26 is shown as being directly connected to the network device 30.

In the above-described communications system, the information signals that are transmitted between the computer 10 and the network device 30 are typically transmitted over a pair of conductors (hereinafter a "differential pair" or simply a "pair") rather than over a single conductor. An information signal is transmitted over a differential pair by transmitting signals on each conductor of the pair that have equal magnitudes, but opposite phases, where the signals transmitted on the two conductors of the pair are selected such that the information signal is the voltage difference between the two transmitted signals. The use of differential signaling can greatly reduce the impact of noise on the information signal.

Various industry standards, such as the TIA/EIA-568-B.2-1 standard approved Jun. 20, 2002 by the Telecommunications Industry Association, have been promulgated that specify configurations, interfaces, performance levels and the like that help ensure that jacks, plugs and cables that are produced by different manufacturers will all work together. By way of example, the TIA/EIA-568-C.2 standard (August 2009) is designed to ensure that plugs, jacks and cable segments that comply with the standard will provide certain minimum levels of performance for signals transmitted at frequencies of up to 250 MHz. Most of these industry standards specify that each jack, plug and cable segment in a communications system must include eight conductors 1-8 that are arranged as four differential pairs of conductors. The industry standards specify that, in at least the connection region where the contacts (blades) of a plug mate with the jackwire contacts of the jack (referred to herein as the "plug jack mating region"), the eight contacts in the plug are generally aligned in a row, as are the corresponding eight contacts in the jack. As shown in FIG. 2, which schematically illustrates the positions of the jackwire contacts of a jack in the plug jack mating region, under the TIA/EIA 568 type B configuration (which is the most widely followed), conductors 4 and 5 comprise differential pair 1, conductors 1 and 2 comprise differential pair 2, conductors 3 and 6 comprise differential pair 3, and conductors 7 and 8 comprise differential pair 4.

Unfortunately, the industry-standardized configuration for the plug-jack mating region that is shown in FIG. 2, which was adopted many years ago, generates a type of noise known as "crosstalk." As is known to those of skill in this art, "crosstalk" refers to unwanted signal energy that is induced onto the conductors of a first "victim" differential pair from a signal that is transmitted over a second "disturbing" differential pair. Various techniques have been developed for cancelling out the crosstalk that arises in industry standardized plugs and jacks. Many of these techniques involve providing crosstalk compensation circuits in each communications jack that introduce "compensating" crosstalk that cancels out much of the "offending" crosstalk that is introduced in the plug and the plug-jack mating region due to the industry-standardized plug jack interface. In order to achieve high levels of crosstalk cancellation, the industry standards specify pre-defined ranges for the crosstalk that is injected between the four differential pairs in each communication plug, which allows each manufacturer to design the crosstalk compensation circuits in their communications jacks to cancel out these pre-defined amounts of crosstalk. Typically, the communications jacks use "multi-stage" crosstalk compensation circuits as disclosed, for example, in U.S. Pat. No. 5,997,358 to Adriaenssens et al. (hereinafter "the '358 patent"), as multi-stage crosstalk compensating schemes can provide significantly improved crosstalk cancellation, particularly at higher frequencies. The entire contents of the '358 patent are hereby incorporated herein by reference as if set forth fully herein.

DETAILED DESCRIPTION

Pursuant to embodiments of the present invention, communications jacks are provided that may have very short signal current carrying paths along the jackwire contacts thereof as compared to communications jacks that use conventional spring jackwire contacts. Herein, the term "signal current carrying path" refers to the physical distance that a communications signal travels along a structure (e.g., a jackwire contact) when the signal passes through the structure on the way to its destination. The signal current carrying paths through the jackwire contacts of the jacks according to embodiments of the present invention may be shortened because, for example, the jackwire contacts may be mounted on a resilient substrate such as a flexible printed circuit board. A separate spring may be used to activate the jackwire contacts. The combination of the flexible structure and the separate spring (if provided) may be used to resiliently mount the jackwire contacts, thereby allowing the use of shorter jackwire contacts that have reduced or even virtually no resilience, while still ensuring that each jackwire contact maintains the requisite contact force against the respective blades of a mating communications plug. By shortening the signal current carrying path through the jackwire contacts, the crosstalk between adjacent contacts may be advantageously reduced. The jackwire contacts may also be mounted in a staggered pattern on the flexible printed circuit board in order to further reduce crosstalk between adjacent jackwire contacts.

In some embodiments, the flexible printed circuit board may include a plurality of fingers. The jackwire contacts may be mounted on these fingers, and the fingers may allow each jackwire contact to deflect substantially independently of adjacent jackwire contacts when the jackwire contacts are engaged by the blades of a mating communications plug. In some embodiments, multiple contacts may be mounted on the same finger, which may facilitate initiating inductive crosstalk compensation at a very short distance (and hence delay) from the plug contact region of the jackwire contacts (i.e., from the plug-jack mating point). The jacks may comprise, for example, RJ-45 or RJ-11 jacks, although embodiments of the present invention are not limited thereto.

Figure 1:
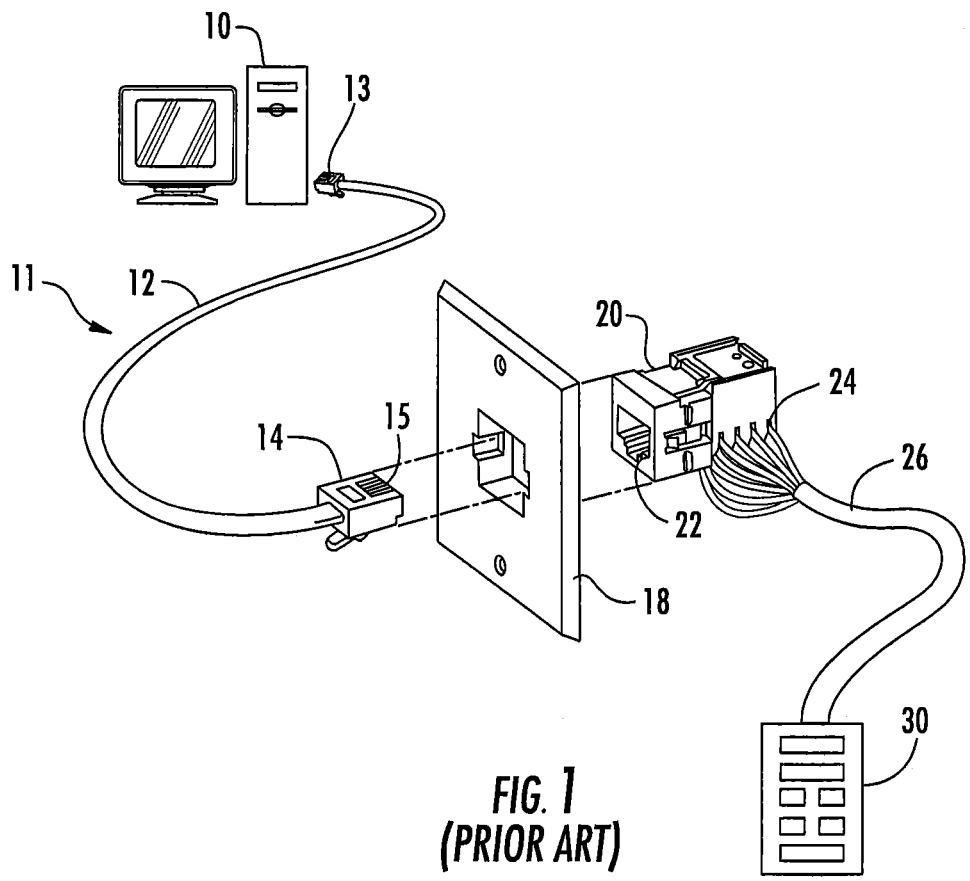
FIG. 1 is a schematic drawing that illustrates the use of communications plug and jack connectors to connect a computer to a network device.
Figure 2:
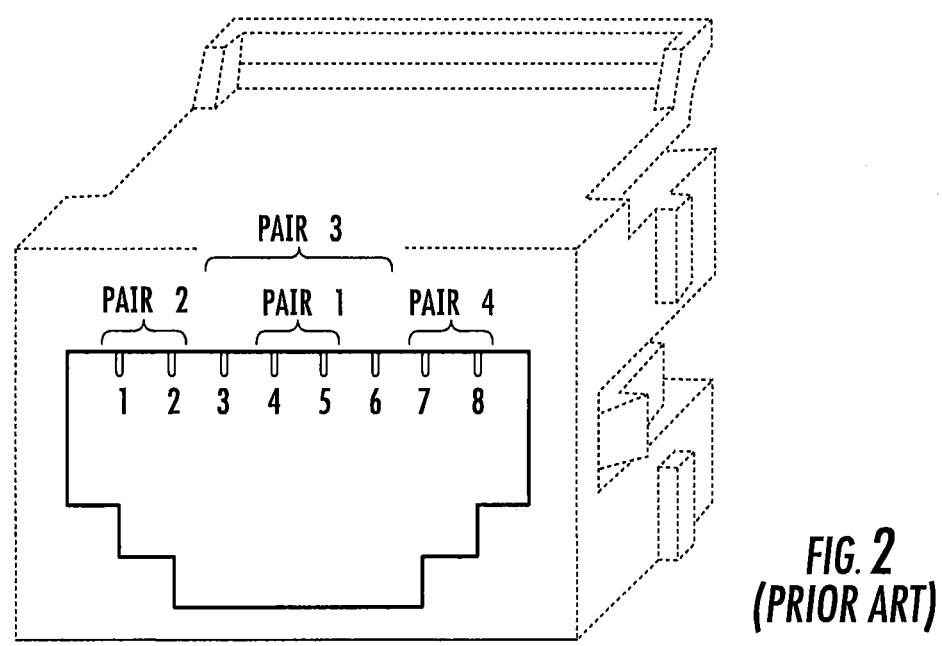
FIG. 2 is a schematic diagram illustrating the TIA/EIA 568 type B modular jack contact wiring assignments for a conventional 8-position communications jack as viewed from the front opening of the jack.
Figure 3:
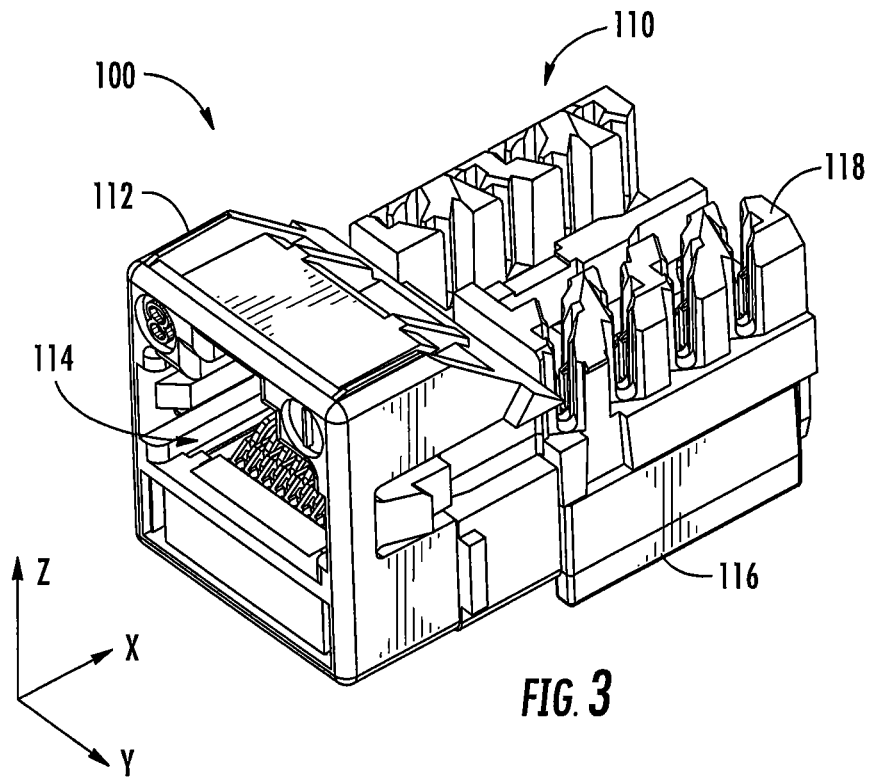
FIG. 3 is a perspective view of a communications jack according to embodiments of the present invention.
Figure 4:
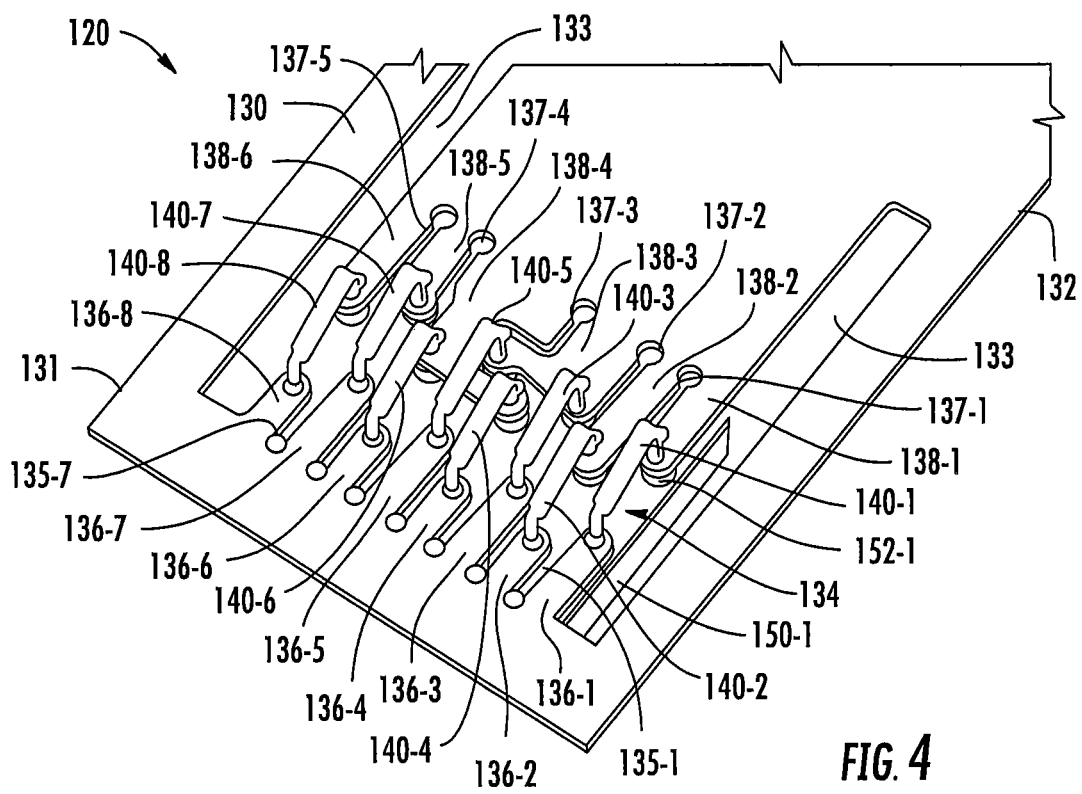
FIG. 4 is a schematic perspective view of a portion of a communications insert of the communications jack of FIG. 3.
Figure 5:
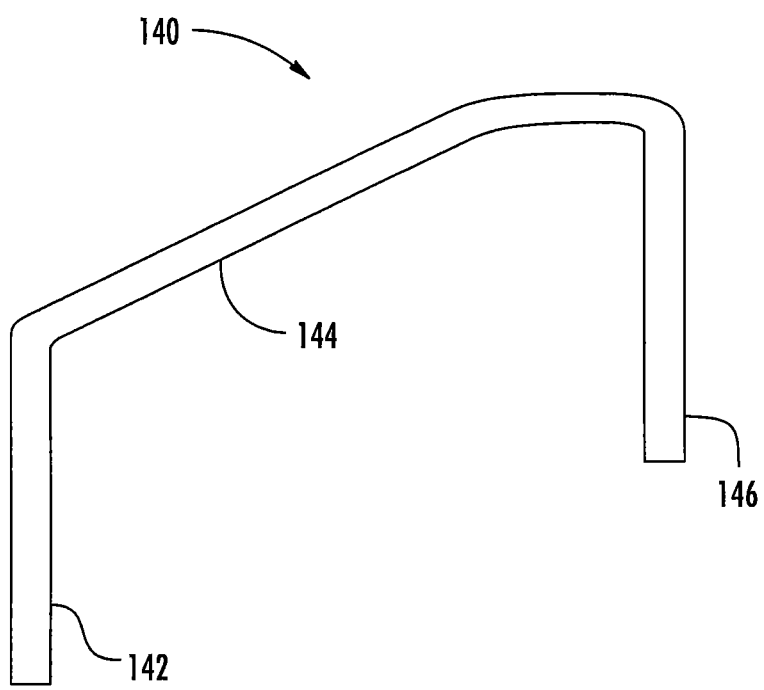
FIG. 5 is a side view of one of the jackwire contacts of the communications insert of FIG. 4.
Figure 6:
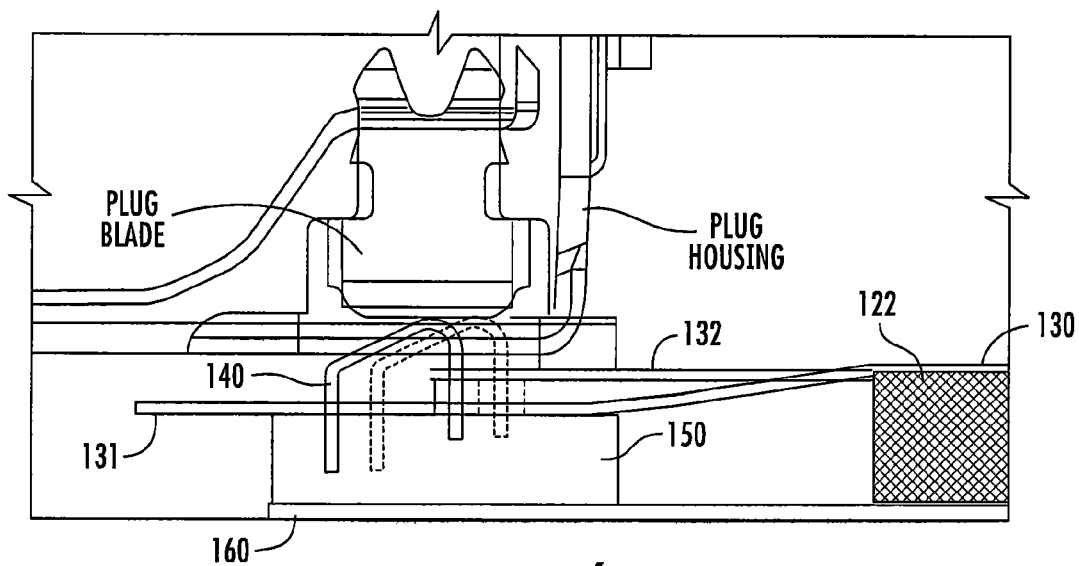
FIG. 6 is a schematic side cross-sectional view of the front portion of the communications insert of FIG. 4 taken along the longitudinal length of one of the jackwire contacts.
Figure 7:
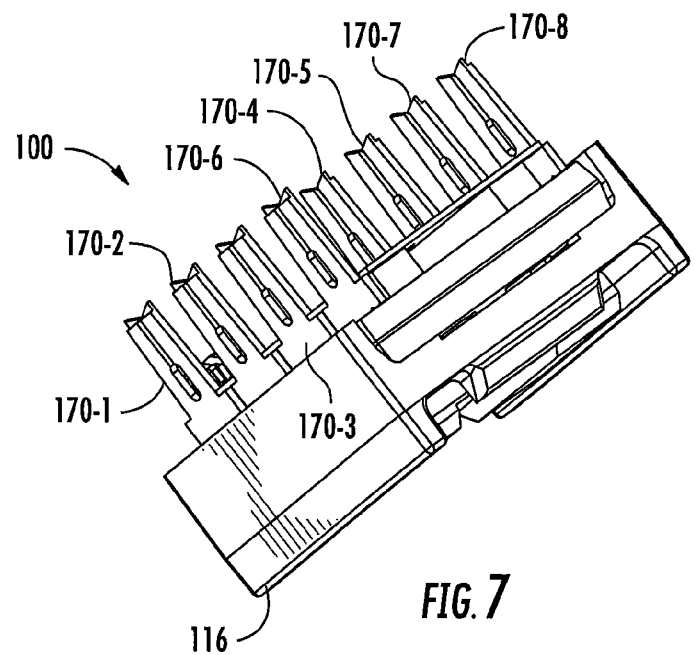
FIG. 7 is a perspective view of the rear portion of the jack of FIG. 3 with the terminal housing removed to expose the output terminals of the jack.
Figure 8:
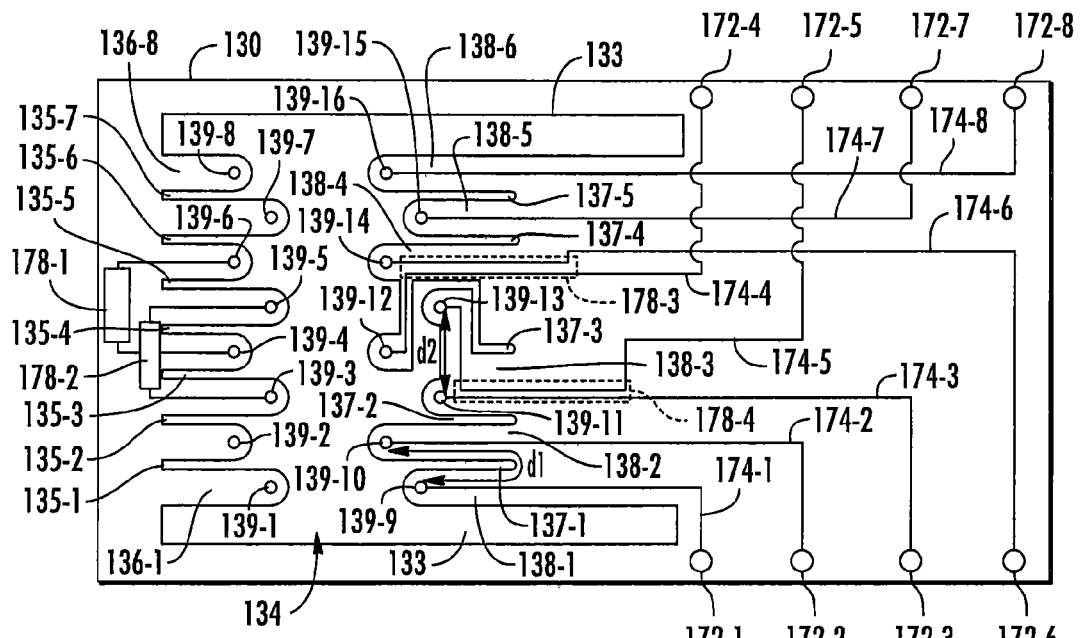
FIG. 8 is a schematic plan view of a flexible printed circuit board of the communications insert of FIG. 4.
Figure 9:
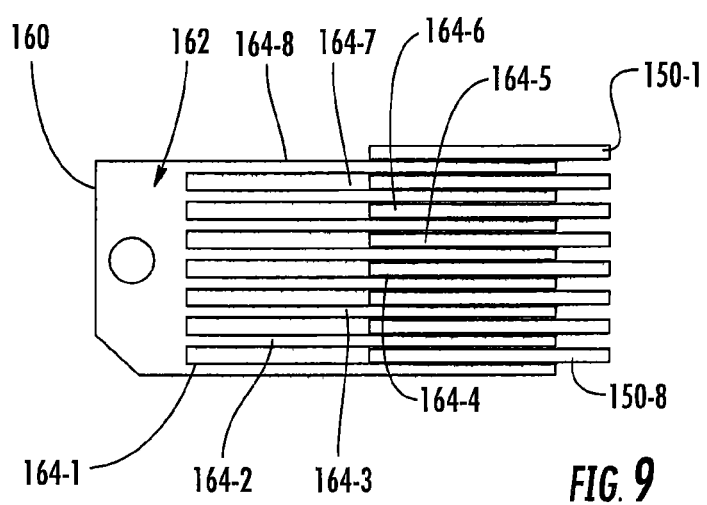
FIG. 9 is a schematic plan view of a spring of the communications insert of FIG. 4.
Figure 10:
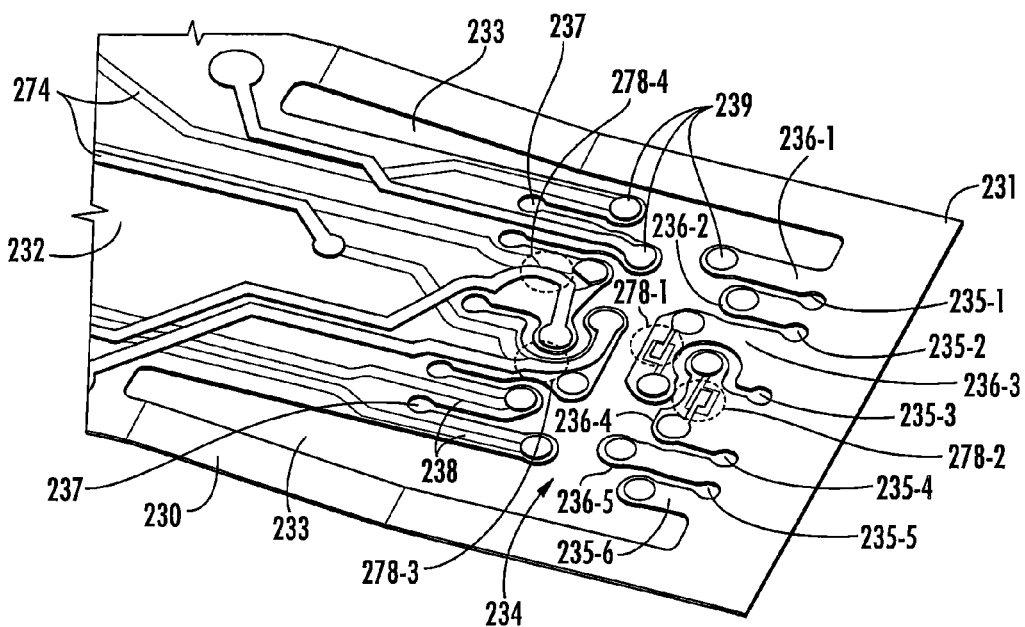
FIG. 10 is a schematic perspective view of a portion of a flexible printed circuit board according to further embodiments of the present invention that may be used in the communications jack of FIG. 3.

Embodiments of the present invention will now be described with reference to the accompanying drawings, in which exemplary embodiments are shown. In particular, FIG. 3 is a perspective view of a communications jack 100 according to embodiments of the present invention. FIG. 4 is a schematic perspective view of a portion of a communications insert 120 for the communications jack 100. FIG. 5 is a side view of one of the jackwire contacts of the communications insert 120. FIG. 6 is a schematic side cross-sectional view of the front portion of the communications insert 120 taken along the longitudinal length of one of the jackwire contacts thereof. FIG. 7 is a perspective view of the rear portion of the jack 100 with the terminal housing removed to expose the output terminals of the jack. FIG. 8 is a schematic plan view of a flexible printed circuit board that is part of the communications insert 120. FIG. 9 is a schematic plan view of a spring of the communications insert of 120. Finally, FIG. 10 is a schematic perspective view of a portion of a flexible printed circuit board according to further embodiments of the present invention that may be used in the communications jack of 100.

As shown in FIG. 3, the jack 100 includes a housing 110. In the depicted embodiment, the housing 110 includes a jack frame 112, a cover 116 and a terminal housing 118. The jack frame 112 includes a plug aperture 114 for receiving a mating communications plug. The housing components 112, 116, 118 may be conventionally formed and need not be described in detail herein. Those skilled in this art will recognize that other configurations of jack frames, covers and terminal housings may also be employed with the present invention, and that the housing 110 may have more or less than three pieces. It will also be appreciated that the jack 100, when mounted for use, is typically rotated 180 degrees about its longitudinal axis from the orientation shown in FIG. 3. In the discussion that follows, the x-direction in FIG. 3 is referred to as the longitudinal direction, the y-direction in FIG. 3 is referred to as the lateral direction, and the z-direction in FIG. 3 is referred to as the vertical direction. In the discussion that follows, the relationships of the components of jack 100 with respect to each other will be described with respect to the orientation illustrated in the figures for convenience.

FIG. 4 illustrates a portion of a communications insert 120 of the jack 100. The forward portion of the communications insert 120 is received within an opening in the rear of the jack frame 112. The bottom of the communications insert 120 is protected by the cover 116, and the top of the communications insert 120 is covered and protected by the terminal housing 118. The communications insert 12Q further includes a flexible printed circuit board 130, a plurality of jackwire contacts 140, a plurality of dielectric contact carriers 150, a spring 160 (see FIG. 9) and a plurality of output contacts 170 (see FIG. 7), each of which will be discussed in further detail below. A substrate 122 (see FIG. 6) may be provided in some embodiments that may be disposed between the cover 116 and the flexible printed circuit board 130.

As shown best in FIGS. 4, 6 and 8, the flexible printed circuit board 130 may comprise an elongated printed circuit board that is formed of a flexible material that may be bent in various ways. In the depicted embodiment, the flexible printed circuit board 130 includes a pair of longitudinal slots 133 that "decouple" a front portion 131 of the flexible printed circuit board 130 from the back portion 132. In particular, the slots 133 allow the front portion 131 of the flexible printed circuit board 130 to be moved within a range without substantially impacting the rear portion 132, and vice versa. As shown in FIG. 6, the slots 133 allow the front portion 131 of flexible printed circuit board 130 to be disposed at a lower level (vertically) within the jack housing 110 than the rear portion 132. While the communications insert 120 includes a single flexible printed circuit board 130, it will be appreciated that in other embodiments two or more printed circuit boards (or other substrates) may be provided. For example, the front portion 131 of the flexible printed circuit board 130 could be replaced with a first flexible or non-flexible printed circuit board and the rear portion 132 of flexible printed circuit board 130 could be replaced with a second flexible printed circuit board in other embodiments of the present invention.

The flexible printed circuit board 130 may include one or more dielectric layers that may have conductive traces and/or other elements disposed on one or both sides thereof, as is known to those of skill in the art. The flexible printed circuit board 130 may be used as a transmission medium for signals that pass between the jackwire contacts 140 and the respective output contacts 170 of the jack 100, as will be explained in more detail with reference to FIG. 8. The flexible printed circuit board 130 may also include a plurality of crosstalk compensation circuits disposed thereon or therein, which will also be discussed in more detail below with reference to FIG. 8.

As is further shown in FIG. 4, the flexible printed circuit board 130 includes a lateral slot 134 that extends between the pair of longitudinally-extending slots 133. Additionally, a plurality of longitudinal slots 135-1 through 135-7 are provided in the front portion 131 of the flexible printed circuit board 130 that define eight rearwardly facing fingers 136-1 through 136-8. Herein, when the communications jacks according to embodiments of the present invention include multiple of the same components, these components may be referred to individually by their full reference numerals (e.g., finger 136-4) and may be referred to collectively by the first part of their reference numeral (e.g., the fingers 136). Likewise, six longitudinal slots 137-1 through 137-6 are provided in the rear portion 132 of the flexible printed circuit board 130 that define a plurality of additional fingers 138-1 through 138-6. As shown in FIG. 4, fingers 138-1, 138-2, 138-5 and 138-6 are generally longitudinally-extending fingers that face forwardly, while fingers 138-3 and 138-4 have both longitudinal and lateral components. Herein, a "finger" on a substrate such as a flexible printed circuit board refers to a cantilevered portion of the substrate, regardless of the particular shape. Thus, it will be understood that the fingers 136, 138 need not be elongated fingers.

The eight fingers 136 may move relatively independent of each other such that each finger 136 may be depressed a different distance downwardly when the jack 100 is mated with a communications plug. Likewise, the six fingers 138 may also move relatively independent of each other in this situation. The ability of each finger 136, 138 to move relatively independent of the other fingers 136, 138 may improve the performance and reliability of the jack 100.

In particular, various industry standards specify certain physical characteristics that must be met for a communications plug to qualify as an industry-standardized communications plug. The physical characteristics specified in these standards include the distances that portions of the plug blades must be from the bottom and front surfaces of the plug housing (when the plug is oriented as shown in FIG. 6), and the industry standards specify ranges for these distances to accommodate manufacturing tolerances. Because ranges are specified, a communications plug may be industry-standard compliant even though its plug blades are not all the same distance from the bottom and/or front surfaces of the plug housing (i.e., the blades may be offset from each other in the longitudinal direction and/or the vertical direction).

When a communications plug that has plug blades that are offset from each other is inserted into the jack 100, certain of the plug blades may engage their respective jackwire contacts 140 of jack 100 sooner than other of the plug blades. The subset of the jackwire contacts 140 that are initially engaged in this fashion exert a downward force on the flexible printed circuit board 130. If the flexible printed circuit board 130 did not include the fingers 136, 138, as the flexible printed circuit board 130 is pushed downwardly, it would draw the remaining jackwire contacts 140 downward as well (i.e., the jackwire contacts 140 that had not yet been engaged by their respective plug blades), pulling these jackwire contacts 140 away from their respective plug blades. As a result, some of the jackwire contacts 140 will exert a greater contact force against their respective plug blades (namely the jackwire contacts 140 that are initially contacted by the offset plug blades) than will other of the jackwire contacts 140. If the flexible printed circuit board 130 does not include the fingers 136, 138 this effect may be magnified such that, under certain circumstances, some of the jackwire contacts 140 may exhibit poor contact force (or even no contact force at all) against their respective plug blades. However, by providing the fingers 136, 138 on the flexible printed circuit board 13Q, the degree to which the movement of a first of the jackwire contacts 140 changes the position of other of the jackwire contacts 140 may be reduced, and hence the jack 100 may be less susceptible to performance degradation when used with plugs that have plug blades that are offset from each other in the longitudinal and/or vertical directions.

As shown best in FIGS. 4-6, eight low coupling jackwire contacts 140-1 through 140-8 are mounted in two rows on a top surface of the flexible printed circuit board 130. Herein, a "jackwire contact" refers to a conductive contact structure of the jack that is mounted in or on a structure so as to extend into the plug aperture of the jack. Each jackwire contact is configured to mate with a blade (or other contact structure) of a communications plug that is received within the plug aperture 114 of the jack 100.

As shown in FIG. 5, each jackwire contact 140 has a first end 142, a second end 146 and a middle section 144 that includes a "plug contact region" (i.e., the portion of the jackwire contact 140 that engages the blade of a mating plug that is received within the plug aperture 114 of jack 100). The jackwire contacts 140 may be formed of, for example, a resilient metal such as beryllium-copper or phosphor-bronze, or a non-resilient metal such as copper or gold-plated copper. In some embodiments, the jackwire contacts 140 may comprise substantially rigid contacts, meaning that the jackwire contacts 140 do not flex more than a de minimis amount when engaged by the respective blades of a mating plug during normal use of the jack 100. The first end 142 of each jackwire contact 140 is mounted to extend upwardly from a respective one of the fingers 136. The first end 142 of each jackwire contact 140 may extend through a respective one of a plurality of metal-plated apertures 139-1 through 139-8 that are provided in the fingers 136. The second end of each jackwire contact 140 is mounted to extend upwardly from a respective one of the fingers 138. The second end 146 of each jackwire contact 140 may extend through a respective one of a plurality of metal-plated apertures 139-9 through 139-16 that are provided in the fingers 138. The metal-plated apertures 139-1 through 139-16 electrically connect each jackwire contact 140 to respective conductive traces or other structures on the flexible printed circuit board 130, as will be discussed in more detail below with reference to FIG. 8.

The first end 142 and the second end 146 of each jackwire contact 140 may each be mounted to be substantially perpendicular to a top surface of the flexible printed circuit board 130 (although they need not be). The middle portion 144 of each jackwire contact 140 may be raised above the top surface of the flexible printed circuit board 130 such that a gap or spacing exists between a lower surface of the middle portion 144 of each jackwire contact 140 and the upper surface of the flexible printed circuit board 130. Additionally, the middle portion 144 of each jackwire contact 140 may define an oblique angle with respect to the plane or planes that are defined by the top surface of the flexible printed circuit board 130, as is shown in FIG. 6.

In some embodiments (such as the depicted embodiment), all of the jackwire contacts 140 may have the same profiles. This may simplify the manufacturing process and may also reduce production costs. However, in other embodiments the jackwire contacts 140 may have different profiles. For example, jackwire contacts 140-1, 140-3, 140-5 and 140-7 may have a first profile, while jackwire contacts 140-2, 140-4, 140-6 and 140-8 may have a second profile that is different from the first profile. The jackwire contact profiles may be designed to reduce coupling between adjacent jackwire contacts 140 by reducing the size of the region where adjacent jackwire contacts 140 are close to each other.

As is shown in FIGS. 4 and 6, the communications insert 120 further includes eight dielectric contact carriers 150-1 through 150-8. Herein, a "contact carrier" refers to a structure that provides mechanical support to a jackwire contact. In the depicted embodiment, each contact carrier 150 comprises an elongated, generally planar strip of molded plastic. Each contact carrier 150 extends parallel to the longitudinal axis of the jack 100, and each contact carrier 150 may be longitudinally aligned with a respective one of the jackwire contacts 140. The contact carriers 150 are aligned side-by-side in a row (in numerical order) in the lateral direction. Each of the dielectric contact carriers 150 includes an upwardly-extending protrusion 152. Each of these protrusions 152 is aligned underneath a respective one of the fingers 138. The first end 142 of each jackwire contact 140 extends through a respective one of the fingers 136 into an aperture in a top surface of the contact carrier 150 that is positioned underneath the jackwire contact 140. The second end 146 of each jackwire contact 140 extends through a respective one of the fingers 138 into an aperture on a respective one of the protrusions 152 on the contact carrier 150 that is positioned underneath the jackwire contact 140. The protrusions 152 act to hold the lower surface of the flexible printed circuit board 130 above the main upper surface of the contact carriers 150 in order to allow the fingers 138 to more freely flex downwardly when a mating plug is received within the plug aperture 114. While not shown in the figures, it will be appreciated that a second, identical, protrusion 152 may also be included on each contact carrier 150 directly underneath each respective finger 136, and that the first end 142 of each respective jackwire contact 140 may be received in these respective second protrusions 152.

While only one of the dielectric contact carriers 150 (namely contact carrier 150-1) is fully illustrated in FIGS. 4 and 6, it will be appreciated that all of the contact carriers 150-1 through 150-8 may be identical except that the location of the protrusions 152 may be adjusted to be underneath the second end 146 of their mating jackwire contact 140. While the contact carriers 150 are completely separate from each other in the depicted embodiment, it will be appreciated that in other embodiments some of the contact carriers 150 may be connected to each other.

Each contact carrier 150 may be mounted to move within the jack 100, as will be discussed in more detail below with respect to FIG. 9. As the ends 142, 146 of each jackwire contact 140 are mounted in a respective one of the contact carriers 150, each dielectric contact carrier 150 and its respective jackwire contact 140 will move together as a single unit when a communications plug is inserted into the plug aperture 114 of jack 100 and physically engages the jackwire contacts 140.

Referring to FIGS. 6 and 9, it can be seen that the communications insert 120 further includes a spring 160. The spring 160 may comprise a comb-like structure that has a base 162 and eight fingers 164-1 through 164-8. The spring 160 may be implemented, for example, as a piece of resilient metal such as beryllium-copper or phosphor-bronze that is mounted, for example, to a bottom surface of the substrate 122 (or another substrate or housing piece of the jack 100) by any appropriate means. However, it will be appreciated that a wide variety of different materials may be used to form the spring 160, including other metals, plastics, etc., and it will also be appreciated that the spring 160 may be implemented in many different forms (e.g., as a coiled spring, a cantilevered spring, etc.). In the illustrated embodiment, a single spring 160 is provided that is used for all eight jackwire contacts 140, but it will be appreciated that in other embodiments more than one spring 160 may be provided (e.g., a separate spring 160 could be provided for each of the jackwire contacts 140).

Each of the contact carriers 150 may be mounted directly on top of a respective one of the eight fingers 164 of spring 160. Alternatively, each finger 164 of the spring may be attached to a side surface of the respective dielectric contact carriers 150. In either case, each finger 164 of the spring 160 is connected to a respective one of the jackwire contacts 140 through a respective one of the contact carriers 150. Each finger 164 of the spring 160 may "spring bias" its associated contact carrier 150 and jackwire contact 140 so that when the contact carrier 150 and jackwire contact 140 are pressed down a spring force is applied that urges the contact carrier 150 and jackwire contact 140 upwardly to return to their normal resting positions.

When a mating plug is received within the plug aperture 114, the plug blades deflect each respective jackwire contact 140 and its associated contact carrier 150 downwardly. The contact carriers 150, in turn, deflect each of the eight fingers 164 of spring 160 downwardly. As the spring 160 is resilient, the fingers 164 of the spring 160 exert an upward force on their respective contact carriers 150, thereby forcing each of the jackwire contacts 140 upwardly to ensure that each jackwire contact 140 engages its mating plug blade with sufficient contact force to ensure that a reliable electrical connection is maintained between the eight blades of the mating plug and the jackwire contacts 140 with which they respectively mate. The spring 160 may be electrically isolated by the contact carriers 150 from the jackwire contacts 140 (and hence is not part of the signal current carrying paths).

As the resiliency of the spring 160 provides the contact force (through the contact carriers 150) that presses the jackwire contacts 140 against the respective blades of a mating plug, the jackwire contacts 140 need not be mounted in cantilevered fashion, nor must they be resilient (although they may be). Consequently, in some embodiments, the jackwire contacts 140 may be very short in length, which can significantly reduce the amount of coupling between adjacent jackwire contacts 140, and hence the amount of offending crosstalk that is generated. For example, the jackwire contacts 140 may each be about 200 mils to about 230 mils in length, in contrast with typical conventional jackwire contacts which may be much longer range, for example, from about 400 mils to about 800 mils in length, or even more.

While not shown in the drawings, a plurality of guiding walls may be provided in, for example, the jack housing 110, that define a plurality of guiding slots therebetween. A portion of each of the contact carriers 150 may be positioned in a respective one of these slots. Each contact carrier 150 may move up and down within its respective slot in response to the insertion or removal of a mating plug, but the slots act to maintain each of the contact carriers 150, and hence the jackwire contacts 140 mounted thereon, in their proper lateral alignment within the plug aperture 114 in order to maintain the jackwire contacts 140 at desired distances from each other and to ensure that the jackwire contacts 140 are properly aligned with their mating plug blades.

As shown best in FIGS. 4, 6 and 8, the jackwire contacts 140 may be aligned in two rows in the lateral direction, with jackwire contacts 140-2, 140-4, 140-6 and 140-8 mounted in a first row that is farther forward on the flexible printed circuit board 130 than jackwire contacts 140-1, 140-3, 140-5 and 140-7, which are mounted in a second row.

FIG. 8 is a schematic plan view of the flexible printed circuit board 130. FIG. 8 more clearly pictures how the slots 133, 134, 135 and 137 are used to form the fingers 136-1 through 136-8 and 138-1 through 138-6 (note that fingers 136-2 through 136-7 are not numbered in FIG. 8 to simplify the drawing, but are aligned in numerical order between fingers 136-1 and 136-8). FIG. 8 also illustrates the metal-plated apertures 139-1 through 139-8 which receive the first end 142 of jackwire contacts 140-1 through 140-8, respectively, and metal-plated apertures 139-9 through 139-16 that receive the second ends 146 of jackwire contacts 140-1 through 140-8, respectively. The first and second ends 142, 146 of the jackwire contacts 140 can be permanently mounted into their respective metal-plated apertures 139-1 through 139-16 by any conventional means such as, for example, welding, soldering or including compliant pin terminations on the ends 142, 146 of each jackwire contact 140. In this fashion, the first end 142 and the second end 146 of each jackwire contact 140 may be electrically connected to conductive structures on the flexible printed circuit board 130 in order to allow electrical signals (and electrical power) to pass between the flexible printed circuit board 130 and the respective jackwire contacts 140.

The flexible printed circuit board 130 may act as a signal carrying structure that passes signals between the eight jackwire contacts 14Q and respective ones of eight output contacts 170 of the jack 100. In particular, as is shown in the schematic diagram of FIG. 8, a plurality of conductive paths 174-1 through 174-8 are provided in or on the flexible printed circuit board 130. Each conductive path 174 connects a respective one of the metal-plated apertures 139-9 through 139-16 to a corresponding one of a plurality of metal-plated apertures 172-1 through 172-8 in order to provide eight conductive paths through the flexible printed circuit board 130. Each conductive path 174 may be formed, for example, as a unitary conductive trace that resides on a single layer of the flexible printed circuit board 130 or as two or more conductive traces that are provided on multiple layers of the flexible printed circuit board 130 and which are electrically connected through metal-filled vias or other layer transferring techniques known to those of skill in the art. The conductive traces 174 may be formed of conventional conductive materials such as, for example, copper, and are deposited on the flexible printed circuit board 13Q via any deposition method known to those skilled in this art.

A plurality of crosstalk compensation circuits 178 such as, for example, interdigitated finger capacitors, plate capacitors, inductively coupling traces and the like may also be provided on and/or within the flexible printed circuit board 130. Two exemplary capacitive crosstalk compensation circuits 178-1, 178-2 in the form of plate capacitors (only the upper plate of each plate capacitor is visible) are illustrated in FIG. 8, as are two exemplary inductive crosstalk compensation circuits 178-3, 178-4. Either or both the capacitive crosstalk compensation circuits 178-1, 178-2 and/or the inductive crosstalk compensation circuits 178-3, 178-4 may be located on portions of the flexible printed circuit board 130 that move when a plug is inserted into the plug aperture 114 of jack 100. Each of these crosstalk compensation circuits will be discussed in more detail below.

As shown in FIG. 7, a plurality of output terminals 170-1 through 170-8 are also mounted to be in electrical contact with the flexible printed circuit board 130. In this particular embodiment, the eight output terminals 170 are implemented as insulation displacement contacts (IDCs) that are mounted in the metal-plated apertures 172-1 through 172-8 (see FIG. 8) in the flexible printed circuit board 130 and extend through the board 130 into the mounting substrate 122. As is well known to those of skill in the art, an IDC is a type of wire connection terminal that may be used to make mechanical and electrical connection to an insulated wire conductor. The IDCs 170 may be of conventional construction and need not be described in detail herein. Any other appropriate output contact may be used including, for example, insulation piercing contacts.

The communications jacks according to embodiments of the present invention may exhibit improved crosstalk performance as compared to many conventional communications jacks.

As is known to those of skill in the art, modern communications jacks such as RJ-45 jacks typically include single-stage or multi-stage crosstalk compensation circuits that are designed to inject "compensating" crosstalk that cancels out "offending" crosstalk that is injected between two differential pairs in a mated communications jack and plug combination due to industry-standardized configurations of the plug blades and the jackwire contacts. However, the compensating crosstalk typically cannot be inserted at precisely the same locations where the offending crosstalk is injected, and thus the compensating crosstalk is typically injected at some delay after the offending crosstalk. Unfortunately, for communications signals at higher frequencies (e.g., at frequencies above 100 MHz and, even more so for frequencies above 250 MHz or 500 MHz), a significant phase shift may occur because of the delay between the locations where the offending and compensating crosstalk are injected, and because of this phase shift, the compensating crosstalk will not completely cancel out the offending crosstalk.

In an effort to address this problem caused by the delay, the aforementioned '358 patent teaches methods of using multi-stage crosstalk compensation in communications jacks that may, theoretically, completely cancel out an offending crosstalk signal having a specific frequency. However, since the frequency of the communications signals that traverse a plug jack connection are typically not known in advance, the techniques of the '358 patent may provide good, but not perfect, crosstalk cancellation at other frequencies. Moreover, because of the aforementioned phase shifts, all other things being equal, better crosstalk performance can typically be achieved the less offending crosstalk that is generated and the closer in time the compensating crosstalk is injected to point where the offending crosstalk is injected.

As is known to those of skill in the art, crosstalk compensation circuits are typically implemented in communications jacks such as RJ-45 jacks capacitive crosstalk compensation circuits and as inductive crosstalk compensation circuits. Capacitive crosstalk compensation circuits are most typically implemented as plate capacitors and/or as interdigitated finger capacitors that are implemented, for example, on a printed circuit board of the jack or in the jackwire contacts of the jack, although other capacitive crosstalk compensation circuits may be used. Inductive crosstalk compensation circuits are most typically implemented as conductive paths that run side-by-side next to each other, either in the jackwire contacts or as conductive traces on a printed circuit board of the jack. Typically, it is desirable to implement the crosstalk compensation scheme using both inductive crosstalk compensation circuits and capacitive crosstalk compensation circuits so that both near end crosstalk and far end crosstalk can be cancelled.

The communications jacks according to embodiments of the present invention may include a variety of features that either reduce the amount of crosstalk that is injected in the plug jack mating region, or that facilitate the injection of compensating crosstalk at a very small delay, as will now be explained.

As one example, capacitive crosstalk compensation circuits such as circuits 178-1, 178-2 are provided in the front portion 131 of the flexible printed circuit board 130. Notably, these capacitive crosstalk compensation circuits 178-1, 178-2 are attached to the first ends 142 of the jackwire contacts, and hence are not on the signal current carrying path through the jack 100. Consequently, the capacitive crosstalk compensation may be injected at a very small delay from the plug jack mating point, as the delay is reduced when the capacitive crosstalk compensation is not on the signal current carrying path. While the embodiment depicted in the figures only shows capacitive crosstalk compensation circuits attached between pairs 1 and 3, it will be appreciated that additional crosstalk compensation circuits may be provided.

The jack 100 is further designed to inject inductive crosstalk compensation at a short delay from the plug jack mating point. The inductive crosstalk compensation is provided in the jack 100 by the inductive crosstalk compensation circuits 178-3, 178-4, each of which are formed by running two of the conductive traces on the flexible printed circuit board close to each other so that the traces inductively couple. In order to inject this inductive crosstalk compensation at a relatively small delay, it is desirable to implement the inductive crosstalk compensation circuit in the flexible printed circuit board 130 very close to the second ends 146 of the jackwire contacts 140 (i.e., as soon as possible to the points where the signals enter the flexible printed circuit board 130 from the jackwire contacts 140). However, as is shown in FIGS. 4 and 8, the longitudinal slots 137 that are provided between the fingers 138 may be relatively long. As such, the shortest path distance along the flexible printed circuit board 130 between two of the metal-plated holes 139 that receive the second ends 146 of two of the jackwire contacts 140 may be fairly long. For example, as an extended longitudinal slot 137-1 separates fingers 138-1 and 138-2, the shortest path distance between the metal-plated apertures 139-9 and 138-10 that are provided on fingers 138-1 and 138-2 may be fairly long, as this shortest path distance must travel all the way around the slot 137-1, as is shown graphically by the arrow labeled "d1" in FIG. 8. As a result, the longitudinal slots 137 may make it difficult to quickly provide inductive crosstalk compensation on the flexible printed circuit board 130 as such inductive compensation is typically implemented by running two conductive traces side-by-side on the so that they inductively couple, and the slots 137 may force a designer to implement such inductive crosstalk compensation at a greater distance, and hence a greater delay, from the jackwire contacts 140. As noted above, crosstalk compensation may be more effective if it may be injected close to the plug jack mating point, and hence this delay in the injection of the inductive crosstalk compensation may make it more difficult to effectively cancel the crosstalk.

Pursuant to embodiments of the present invention, the second ends 146 of two (or more) of the jackwire contacts 140 may be co-mounted on the same finger 138. In particular, as shown in FIGS. 4 and 8, the second ends 146 of jackwire contacts 140-3 and 140-5 are both located on finger 138-3, and the second ends of jackwire contacts 140-4 and 140-6 are both located on finger 138-4. This arrangement can significantly reduce the shortest path distance between the metal-plated apertures (e.g., metal-plated apertures 139-11 and 139-13 that receive the second ends 146 of jackwire contacts 140-3 and 140-5, respectively) that are co-located on the same finger 138. For example, as shown in FIG. 8, the shortest path distance between metal-plated apertures 139-11 and 139-13 (labeled "d2" in FIG. 8) may be less than half the shortest path distance (e.g., distance d1) between two metal-plated apertures 139 that are not co-located on the same finger 138. The same is true with respect to metal-plated holes 139-12 and 139-14, because their corresponding jackwire contacts 140-4 and 140-6 are also co-located on the same finger 138-4.

As shown on FIG. 8, the conductive traces 174-3 and 174-5 that are connected to the metal-plated apertures 139-11 and 139-13 include an inductive coupling section 178-4 that provides inductive crosstalk compensation between pairs 1 and 3. Likewise, the conductive traces 174-4 and 174-6 that are connected to the metal-plated apertures 139-12 and 139-14 include an inductive coupling section 178-3 that also provides inductive crosstalk compensation between pairs 1 and 3. The inductive coupling sections 178-3, 178-4 are each located a very short distance (here distance d2), and hence a short delay, from the jackwire contacts 140, and thus may provide more effective crosstalk compensation.

The design of the jackwire contacts 140 may also improve the crosstalk performance of the jack 100. Most conventional RJ-45 communications jacks implement the plug contacts using spring jackwires that are elongated contact wires that are formed of beryllium-copper or phosphor-bronze. These contact wires may be formed to be sufficiently resilient such that the plug contact will meet industry standardized specifications with respect to the contact force that each plug contact applies to a mating plug blade and/or to ensure that the contact wires do not become permanently deformed with use. Typically, relatively long contact wires must be used in order to ensure that the contact wire provides the requisite contact force. In contrast, the jackwire contacts 140 that may be included in communications jacks according to embodiments of the present invention may be significantly shorter, and thus the signal current carrying path through each of the input contacts 140 may be very short in length. In particular, the signal current carrying path through each jackwire contact 140 extends from the middle region 144 of the jackwire contact 140 (i.e., the part of the plug contact that engages a mating plug blade) to the second end 146 of the contact 140. In some embodiments, the length of each jackwire contact 140 may be between about 200 mils and about 230 mils, which is far less than the length of most conventional spring jackwire contacts. As a result, the coupling, and hence the crosstalk, between adjacent jackwire contacts 140 may be significantly reduced.

Additionally, as is discussed above, the jackwire contacts 140 may be aligned in two staggered rows in the lateral direction. By aligning the jackwire contacts 140 in two staggered rows, it is possible to further reduce the amount of offending crosstalk that is generated between the differential pairs. By way of example, in the plug jack mating region, typically jackwire contact 2 (which is part of pair 2) will couple a greater amount of signal energy onto jackwire contact 140-3 (which is part of pair 3) than will jackwire contact 140-1 (which is the other jackwire contact of pair 2), as jackwire contact 140-2 is directly adjacent to jackwire contact 14Q-3, while jackwire contact 140-1 is positioned farther away from jackwire contact 140-3. Consequently, this unequal coupling by the conductors of pair 2 onto pair 3 results in offending crosstalk from pair 2 onto pair 3 (and vice versa). By staggering jackwire contact 140-2 with respect to jackwire contacts 140-1 and 140-3 (i.e., by moving jackwire contact 140-2 forwardly into the first row), the amount of coupling between jackwire contact 140-2 and 140-3 can be reduced, thereby reducing the amount of unequal coupling from the conductors of pair 2 onto jackwire contact 140-3. Moreover, as jackwire contacts 140-1 and 140-3 are both aligned in the second row, the amount of coupling between jackwire contact 140-1 and 140-3 is not reduced and, in fact, is increased since jackwire contact 140-2 is no longer fully interposed between jackwire contacts 140-1 and 140-3. As the coupling from jackwire contact 140-1 onto jackwire contact 140-3 cancels out the coupling from jackwire contact 140-2 onto jackwire contact 140-3, this further reduces the amount of offending crosstalk that is generated between pair 2 and pair 3. Similar beneficial reductions in the amount of offending crosstalk may be achieved on each adjacent pair combination. Thus, the staggering of the input contacts 140 into first and second rows may further reduce the amount of offending crosstalk generated in the jack 100.

FIG. 10 is a schematic perspective view of a portion of a flexible printed circuit board 230 according to further embodiments of the present invention that may be used in the communications jack of FIG. 3. The flexible printed circuit board 230 may be used in place of the flexible printed circuit board 130 in jack 100. As the flexible printed circuit board 230 and the flexible printed circuit board 130 are quite similar, the discussion that follows will focus on differences between these two printed circuit board configurations. The flexible printed circuit board 230 may be used in the communications insert 120 discussed above in conjunction with the substrate 122, the jackwire contacts 140, the dielectric contact carriers 150, the spring 160 and the output contacts 170 that are discussed above.

As shown in FIG. 10, the flexible printed circuit board 230 includes a pair of longitudinal slots 233 that "decouple" a front portion 231 of the flexible printed circuit board 230 from the back portion 232, and a lateral slot 234 that extends between the pair of longitudinally-extending slots 233. In an alternative embodiment, the slots 233 may be omitted and the lateral slot 234 may be extended all the way to the side edges of the flexible printed circuit board 230 in order to cut the flexible printed circuit board 230 into two separate pieces (namely a front piece 231 and a rear piece 232).

The flexible printed circuit board 230 includes one or more dielectric layers. A plurality of conductive traces are disposed on various of these layers. These conductive traces are used to form conductive paths 274 that act as transmission mediums for signals that pass between the jackwire contacts 140 and the respective output contacts 170 of a jack that uses the flexible printed circuit board 230. In the depicted embodiment, the flexible printed circuit board 230 includes one dielectric layer with conductive traces and other conductive structures disposed on either side thereof (i.e., on the top and bottom sides of the flexible printed circuit board 230). However, in other embodiments, more than one dielectric layer may be included and conductive traces and/or elements may be included on one or more intermediate layers.

The flexible printed circuit board 232 includes six longitudinal slots 237 in the rear portion thereof that define a plurality of fingers 238. As these slots 237 and fingers 238 are identical to the slots 137 and the fingers 138 that are provided on flexible printed circuit board 130 they will not be described further herein.

The flexible printed circuit board 230 further includes a plurality of slots 235-1 through 235-5. Slots 235-1, 235-2, 235-4 and 235-5 may be essentially identical to slots 135-1, 135-2, 135-6 and 135-7 of the flexible printed circuit board 130 discussed above. These slots 235-1, 235-2, 235-4 and 235-5 define four rearwardly facing fingers 236-1, 236-2, 236-5 and 236-6. Slot 235-3 (along with slots 235-2 and 235-4) defines two additional fingers 236-3 and 236-4 that have both longitudinal and lateral components.

The jackwire contacts 140 are mounted on the flexible printed circuit board 230 by inserting the first end 142 of each jackwire contact 140 into one of a plurality of metal-plated apertures 239 that are provided in the fingers 236 and by inserting the second end 146 of each jackwire contact 140 into a respective one of a plurality of metal-plated apertures 239 that are provided in the fingers 238. As shown in FIG. 10, conductive paths 274 are connected to metal-plated apertures 239 provided on fingers 238 that electrically connect each jackwire contact 140 to the respective output terminals 170 (not visible in FIG. 10).

As discussed above with respect to fingers 136 and 138 of the flexible printed circuit board 130 of FIG. 4, the fingers 236 and 238 are provided so that the jackwire contacts 140 may move relatively independent of each other and, in particular, be depressed a different distance downwardly when a mating plug is received within the jack 100. However, as is discussed above with respect to FIGS. 4 and 8, the longitudinal slots 137 that are used to form the fingers 138 may be relatively long, and hence make it difficult to quickly provide inductive crosstalk compensation on the flexible printed circuit board 130. Accordingly, the second ends 146 of both jackwire contacts 140-3 and 140-5 are co-located on finger 138-3, and the second ends of both jackwire contacts 140-4 and 140-6 are co-located on finger 138-4. The same design is followed in the embodiment of FIG. 10 with respect to fingers 238-3 and 238-4. This arrangement facilitates implementing two inductive crosstalk compensation circuits 278-3 and 278-4 that provide inductive crosstalk compensation between pairs 1 and 3 at a very small delay from the plug jack mating point, as can be seen in FIG. 10.

In the embodiment of FIG. 10, the longitudinal fingers 136-3 through 136-6 from the embodiment of FIGS. 4 and 8 are replaced with fingers 236-3 and 236-4 that each have both longitudinal and transverse components. This design allows the capacitive crosstalk compensation circuits 278-1 and 278-2 to be implemented significantly closer to the conductive vias 239 on finger 236-3 (for capacitive crosstalk compensation circuit 278-1) and to the conductive vias 239 on finger 236-4 (for capacitive crosstalk compensation circuit 278-2), and hence closer to the plug jack mating point. This may potentially provide more effective crosstalk cancellation.

In the embodiments described above, the jackwire contacts 140 are mounted on the flexible printed circuit boards 130, 230 by inserting the first end 142 of each jackwire contact 140 into one of a plurality of metal-plated apertures 139, 239 that are provided in the fingers 136, 236, and by inserting the second end 146 of each jackwire contact 140 into a respective one of a plurality of metal-plated apertures 239 that are provided in the fingers 138, 238 such that both ends 142, 146 of each jackwire contact 140 are mounted on the flexible printed circuit board 130, 230 (or potentially on another printed circuit board or mounting substrate). However, it will be appreciated that, in further embodiments of the present invention, sliding contact arrangements may be used on at least one end of some or all of the jackwire contacts 140.

For example, referring to FIG. 4, in further embodiments of the present invention, some or all of the metal-plated apertures 139-9 through 139-16 may be replaced with conductive (e.g., copper) pads that are provided on the top surface of the fingers 138 in the same positions as the metal plated apertures 139-9 through 139-16. The second end 146 of the jackwire contacts 140 may be designed to have a pad mating region that is configured to make physical and electrical contact with a respective one of these contact pads when a mating plug is received within the plug aperture 114 of jack 100. The forces applied by the plug blades on the jackwire contacts 140 and the countervailing force applied by the spring 160 on the fingers 138 may ensure that the second end 146 of each jackwire contact 140 firmly mates with its respective contact pad to provide a good electrical connection therebetween. Thus, in some embodiments, both ends of the jackwire contacts 140 need not be permanently mounted on the flexible printed circuit board or other mounting substrate.

While various of the above-described communications jacks include a flexible printed circuit board that may be cut in two to form two flexible printed circuit boards, it will be appreciated that embodiments of the present invention are not limited to such an implementation. For example, in some embodiments, the flexible printed circuit board may not be cut so that the jack includes a single flexible printed circuit board. In other embodiments, a flexible printed circuit board may hold, for example, the rear ends of the jackwire contacts (i.e., the ends that are closest to the IDCs) while a conventional printed circuit board may hold the front ends of the jackwire contacts. In still other embodiments, a flexible printed circuit board may hold, for example, the rear ends of the jackwire contacts while the front ends of the jackwire contacts may be mounted in another mounting substrate such as, for example, a piece of the jack housing or a dielectric block. In still other embodiments, one or more composite flexible printed circuit boards may be used such as, for example, a rigid/flex printed circuit board that has a flexible portion and a rigid portion. For example, the flexible printed circuit board that receives the rear ends of the jackwire contacts could be implemented using a rigid/flex printed circuit board instead, with the flexible portion receiving the rear ends of the jackwire contacts and the rigid portion receiving the IDCs or other output terminals. This may simplify mechanically and electrically connecting the output terminals to the printed circuit board and/or provide a more robust connection between the output terminals and the printed circuit board. It will also be appreciated that more than two printed circuit boards may be used and that not all of the front (or rear) ends of the jackwire contacts need be mounted in the same printed circuit board or other mounting substrate.

While embodiments of the present invention have primarily been discussed herein with respect to communications jacks that include eight conductive paths that are arranged as four differential pairs of conductive paths, it will be appreciated that the concepts described herein are equally applicable to jacks that include other numbers of differential pairs.

While the present invention has been described above primarily with reference to the accompanying drawings, it will be appreciated that the invention is not limited to the illustrated embodiments; rather, these embodiments are intended to fully and completely disclose the invention to those skilled in this art. In the drawings, like numbers refer to like elements throughout. Thicknesses and dimensions of some components may be exaggerated for clarity.

Spatially relative terms, such as "under", "below", "lower", "over", "upper", "top", "bottom" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "under" or "beneath" other elements or features would then be oriented "over" the other elements or features. Thus, the exemplary term "under" can encompass both an orientation of over and under. The device may be otherwise oriented (rotated 90 degrees or at other orientations) and the spatially relative descriptors used herein interpreted accordingly.

Well-known functions or constructions may not be described in detail for brevity and/or clarity. As used herein the expression "and/or" includes any and all combinations of one or more of the associated listed items.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises", "comprising", "includes" and/or "including" when used in this specification, specify the presence of stated features, operations, elements, and/or components, but do not preclude the presence or addition of one or more other features, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Herein, the terms "attached", "connected", "interconnected", "contacting", "mounted" and the like can mean either direct or indirect attachment or contact between elements, unless stated otherwise.

Although exemplary embodiments of this invention have been described, those skilled in the art will readily appreciate that many modifications are possible in the exemplary embodiments without materially departing from the novel teachings and advantages of this invention. Accordingly, all such modifications are intended to be included within the That which is claimed is:

1. A communications jack, comprising:
a housing having a plug aperture in a front portion thereof;
a flexible printed circuit board that is at least partly within the housing;
a plurality of jackwire contacts that each extend from and are electrically connected to the flexible printed circuit board; and
wherein a first subset of the jackwire contacts are substantially aligned in a first row across the plug aperture and a second subset of the jackwire contacts are substantially aligned in a second row across the plug aperture, the second row being offset from the first row.

2. The communications jack of claim 1, wherein the flexible printed circuit board is configured to move within the jack housing in response to movement of the jackwire contacts.

3. The communications jack of claim 1, further comprising a plurality of dielectric contact carriers, wherein each of the jackwire contacts is mounted in a respective one of the dielectric contact carriers, and wherein each of the dielectric contact carriers are configured to move substantially independently of the other dielectric contact carriers within the housing in response to a plug being inserted within the plug aperture.

4. The communications jack of claim 1, wherein middle portions of at least some of the jackwire contacts are positioned above a cutout area in the flexible printed circuit board.

5. The communications jack of claim 2, wherein the flexible printed circuit board includes a plurality of cantilevered fingers, and wherein at least one end of each of the jackwire contacts is mounted on a respective one of the fingers.

6. The communications jack of claim 5, wherein a first subset of the plurality of fingers extend in a generally longitudinal direction of the jack, and wherein at least one other of the plurality of fingers extends in a generally lateral direction of the jack.

7. The communications jack of claim 5, wherein a first of the jackwire contacts crosses over a finger that has a second of the jackwire contacts mounted thereon.

8. The communications jack of claim 1, further comprising a spring that spring biases at least one of the jackwire contacts, the spring being electrically isolated from the at least one of the jackwire contacts.

9. The communications jack of claim 1, wherein each jackwire contact has a first end and a second end, wherein the first end of each jackwire contact is mounted through the flexible printed circuit board, and wherein the second end of at least a subset of the jackwire contacts is also a mounted end.

10. The communications jack of claim 9, wherein the second end of each of the subset of the jackwire contacts is also mounted in the flexible printed circuit board.

11. The communications jack of claim 9, wherein the second end of each of the subset of the jackwire contacts is mounted in a second printed circuit board.

12. The communications jack of claim 1, further comprising at least one spring that spring biases at least one of the jackwire contacts, wherein portions of the flexible printed circuit board are cantilevered and move in response to movement of the jackwire contacts.

13. A communications jack, comprising:
a housing having a plug aperture in a front portion thereof;
a flexible printed circuit board having at least a first finger, a second finger, a third finger, a fourth finger, a fifth finger and a sixth finger, the flexible printed circuit board being at least partly within the housing; and
at least a first jackwire contact, a second jackwire contact, a third jackwire contact, a fourth jackwire contact, a fifth jackwire contact, a sixth jackwire contact, a seventh jackwire contact and an eighth jackwire contact, wherein each of the first through eighth jackwire contacts has a first end that is mounted in one of the first through sixth fingers.

14. The communications jack of claim 13, wherein the first and second jackwire contacts are each part of a first differential communications path through the jack and the third jackwire contact is part of a second differential communications path through the jack, and wherein the first and third jackwire contacts are mounted on the first finger.

15. The communications jack of claim 14, wherein the jackwire contacts are generally aligned in a lateral direction of the jack, and wherein the second jackwire contact is between the first jackwire contact and the third jackwire contact.

16. A communications jack, comprising:
a housing having a plug aperture in a front portion thereof;
a flexible printed circuit board that is at least partly within the housing;
a plurality of jackwire contacts that each have a first end that is mounted through and electrically connected to the flexible printed circuit board; and
a spring system that is separate from the jackwire contacts that spring biases the jackwire contacts,
wherein portions of the flexible printed circuit board move in response to movement of the jackwire contacts.

17. The communications jack of claim 16, further comprising a plurality of dielectric contact carriers that are interposed between the jackwire contacts and the spring system.

18. The communications jack of claim 16, wherein at least some of the jackwire contacts are mounted on respective ones of a plurality of cantilevered fingers that are formed in the flexible printed circuit board.

19. The communications jack of claim 16, wherein at least some of the jackwire contacts are not mounted as cantilevered jackwire contacts.

20. The communications jack of claim 16, wherein the spring system is electrically isolated from the jackwire contacts.

* * * * *